(12) United States Patent
Hashimoto et al.

(10) Patent No.: US 8,187,910 B2
(45) Date of Patent: May 29, 2012

(54) SEMICONDUCTOR DEVICE MANUFACTURING METHOD

(75) Inventors: Kouhei Hashimoto, Ebina (JP); Masatsugu Itahashi, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 503 days.

(21) Appl. No.: 12/537,568

(22) Filed: Aug. 7, 2009

(65) Prior Publication Data

US 2010/0055825 A1 Mar. 4, 2010

(30) Foreign Application Priority Data

Aug. 26, 2008 (JP) ................. 2008-217324

(51) Int. Cl.
*H01L 21/00* (2006.01)

(52) U.S. Cl. .................. 438/75; 257/E21.218

(58) Field of Classification Search .......... 438/75; 257/E21.218, E21.256, E21.252
See application file for complete search history.

(56) References Cited

U.S. PATENT DOCUMENTS

| 6,653,240 B2 * | 11/2003 | Crawford .................. 438/712 |
| 7,037,732 B2 * | 5/2006 | Maruta et al. ............... 438/4 |
| 2004/0038433 A1 * | 2/2004 | Fischer et al. .............. 438/4 |
| 2009/0130782 A1 | 5/2009 | Itahashi et al. ............. 438/6 |

FOREIGN PATENT DOCUMENTS

| JP | 9-082806 A | 3/1997 |
| JP | 11-025853 A | 1/1999 |
| JP | 2005-079491 A | 3/2005 |
| JP | 2005-129592 A | 5/2005 |

\* cited by examiner

*Primary Examiner* — Thao P. Le
(74) *Attorney, Agent, or Firm* — Fitzpatrick, Cella, Harper & Scinto

(57) ABSTRACT

A method for manufacturing a semiconductor device that includes a semiconductor substrate, the method comprises: a first irradiation step of irradiating a first irradiated region with a focused ion beam so as to selectively remove a first portion corresponding to the first irradiated region of the wiring pattern, the first irradiated region being positioned on an inner side of a short defect portion of the wiring pattern in a direction along a plane parallel to the principal surface; and a second irradiation step of, after the first irradiation step, irradiating a second irradiated region with a focused ion beam so as to remove a second portion corresponding to the second irradiated region of the wiring pattern, the second irradiated region including a region that is positioned on an outer side of the short defect portion in the direction along the plane parallel to the principal surface.

7 Claims, 4 Drawing Sheets

F I G. 4A
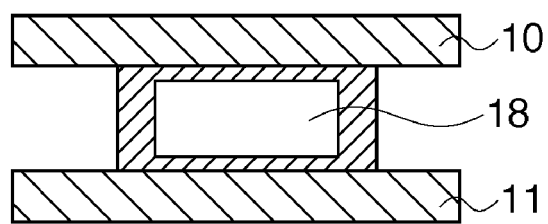
F I G. 4B
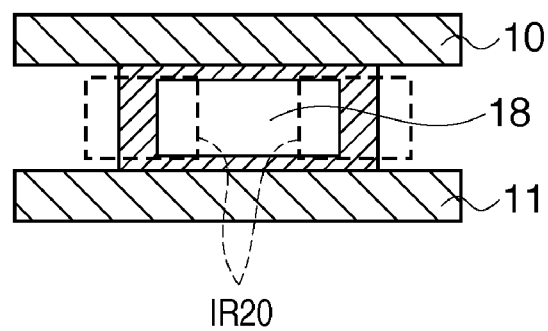
F I G. 4C
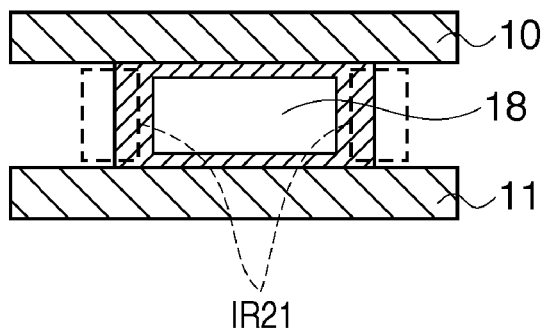

SEMICONDUCTOR DEVICE MANUFACTURING METHOD

BACKGROUND OF THE INVENTION

1. Field of the Invention

The present invention relates to a semiconductor device manufacturing method.

2. Description of the Related Art

A semiconductor device manufacturing process includes a process for forming semiconductor elements such as transistors on/in a semiconductor substrate, and a wiring process for forming a wiring pattern via an interlayer insulation film above semiconductor elements such as transistors. Wirings are often formed in multi-layers. The process for forming a wiring pattern of each layer includes a film formation process, a photolithography process, an etching process, and other processes. In some cases, an unintentional short defect portion may be formed on a wiring pattern due to dust or the like generated from the semiconductor manufacturing devices used in those steps.

In a semiconductor device manufacturing process, defect inspection for detecting an unintentional short defect portion is conducted after wiring pattern formation. Such defect inspection is conducted in order to check whether or not the density of short defect portions is within a permissible level. This defect inspection is employed for the purpose of controlling the quality of semiconductor devices or monitoring the condition of dust in each device. Defect inspection is used not only just for production control but also to repair, using inspection results, an unintentionally formed short defect portion.

Japanese Patent Laid-Open No. 11-25853 has disclosed that a short defect portion 2 of a silver electrode 1 formed on a glass substrate 9 of a plasma display is removed by processing with laser beams, as illustrated in FIG. 2A of Japanese Patent Laid-Open No. 11-25853.

Japanese Patent Laid-Open No. 9-082806 has disclosed that the short-circuited part between power source wirings 8b1 and 8b2 is separated from a power source wiring system in a power source wiring block 7 by a focused ion beam (FIB) cutting at cut points C1 to C4 as illustrated in FIG. 13 of Japanese Patent Laid-Open No. 9-082806.

In the case of using laser beams, it is considered difficult to remove a short defect portion of a wiring pattern in a semiconductor device at the submicron level. The use of a focused ion beam, on the other hand, enables a short defect portion of a wiring pattern in a semiconductor device to be removed at the submicron level.

With the technique disclosed in Japanese Patent Laid-Open No. 9-082806, however, wiring patterns or insulation films around or below the cut points C1 to C4 may be damaged by ion irradiation.

SUMMARY OF THE INVENTION

The present invention provides for reducing damage to an insulation film around or below the short defect portion when removing a short defect portion of a wiring pattern with a focused ion beam.

A method according to an aspect of the present invention is a method for manufacturing a semiconductor device that includes a semiconductor substrate having a principal surface above which a wiring pattern is formed, the method comprising: a first irradiation step of irradiating a first irradiated region with a focused ion beam so as to selectively remove a first portion corresponding to the first irradiated region of the wiring pattern, the first irradiated region being positioned on an inner side of a short defect portion of the wiring pattern in a direction along a plane parallel to the principal surface; and a second irradiation step of, after the first irradiation step, irradiating a second irradiated region with a focused ion beam so as to remove a second portion corresponding to the second irradiated region of the wiring pattern, the second irradiated region including a region that is positioned on an outer side of the short defect portion in the direction along the plane parallel to the principal surface.

According to the present invention, it is possible to reduce damage that can be done to an insulation film around or below a short defect portion of a wiring pattern when the short defect portion is removed with a focused ion beam.

Further features of the present invention will become apparent from the following description of exemplary embodiments with reference to the attached drawings.

BRIEF DESCRIPTION OF THE DRAWINGS

FIGS. 4A to 4C are plan views illustrating the details of the second irradiated region in the second irradiation step (S-15) (variation).

DESCRIPTION OF THE EMBODIMENTS

Figure 1A:
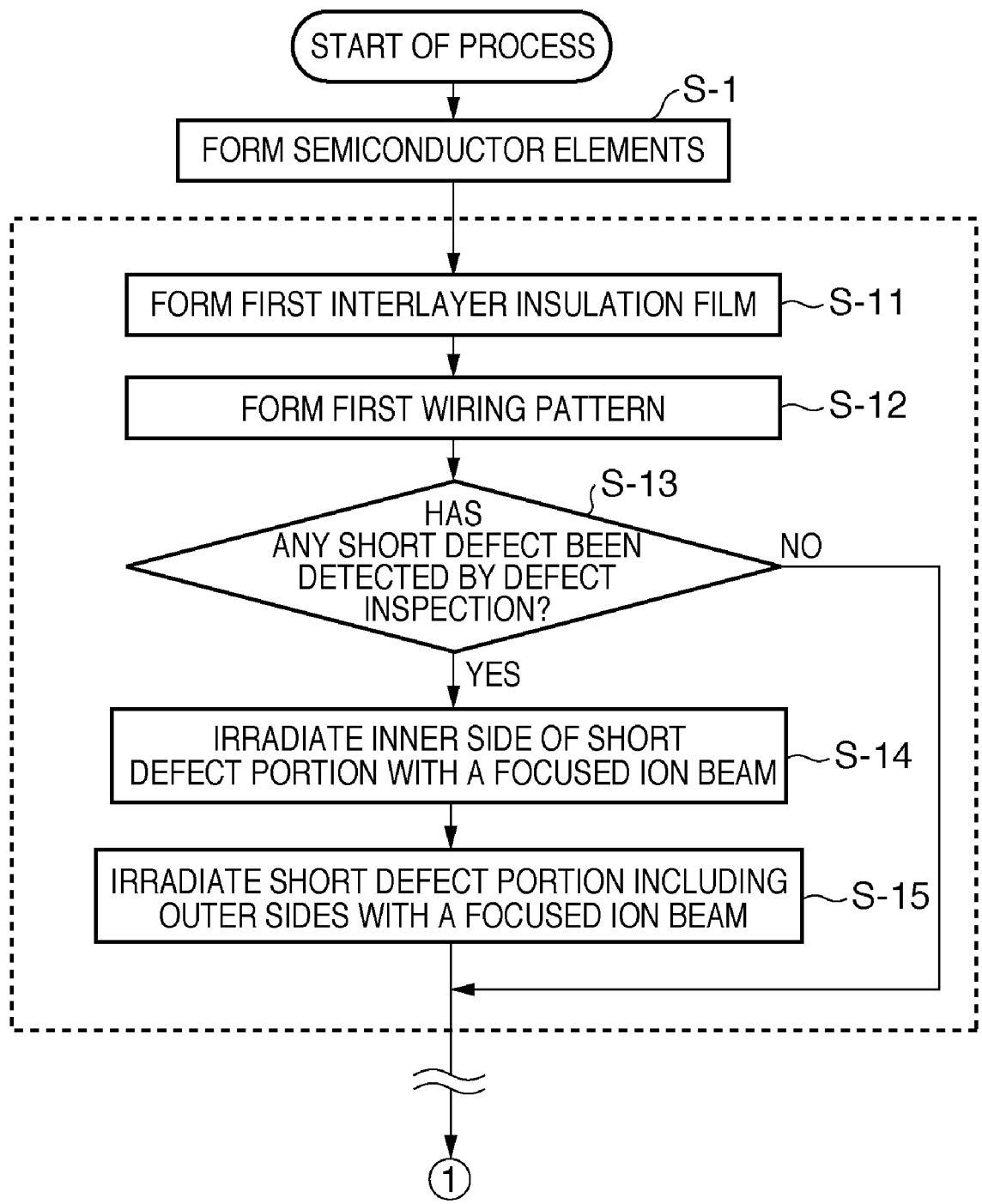
FIGS. 1A and 1B are flow charts showing the procedure of a semiconductor device manufacturing method according to an exemplary embodiment of the present invention.
Figure 1B:
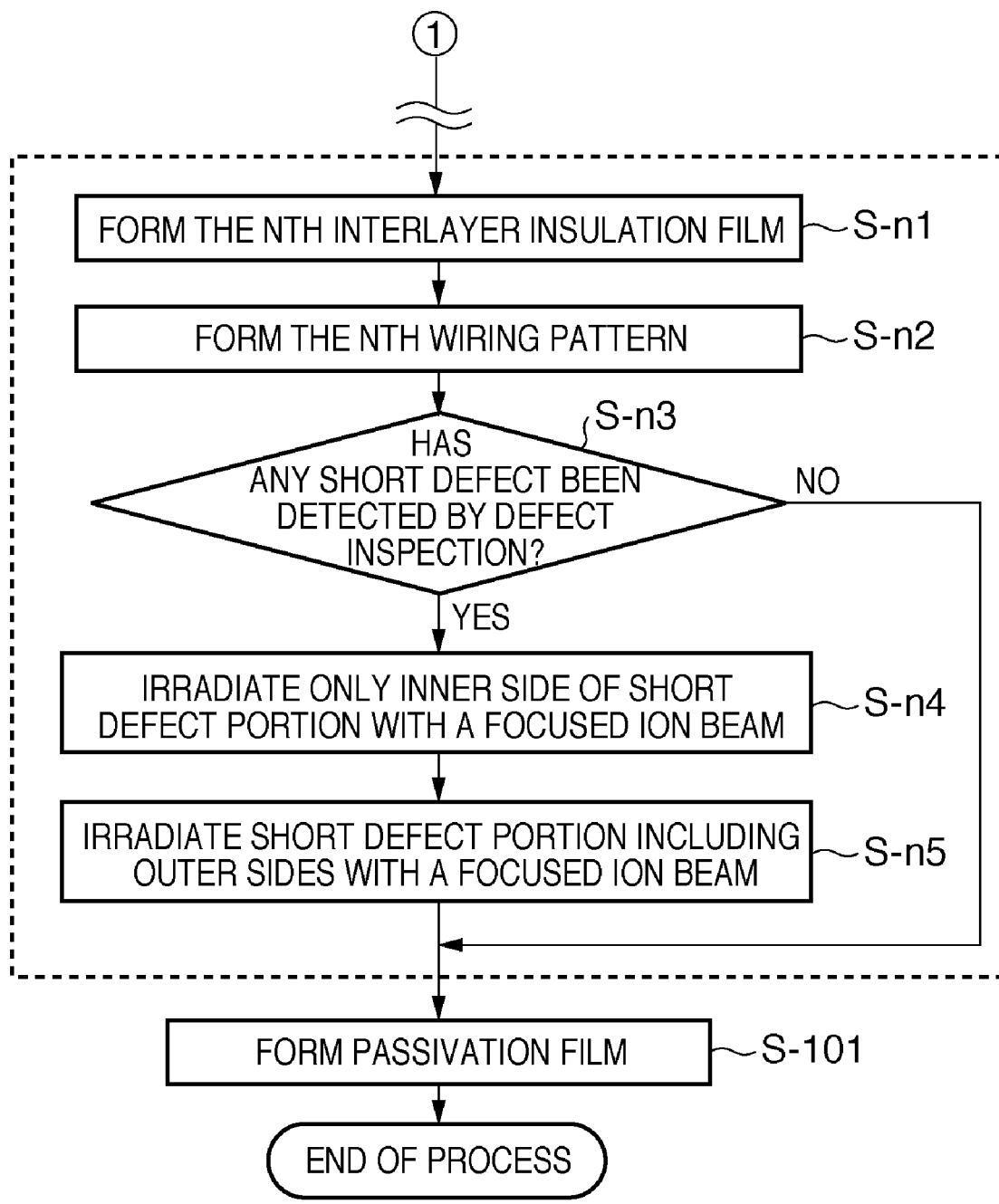

A semiconductor device manufacturing method according to an exemplary embodiment of the present invention will be described with reference to FIGS. 1A and 1B. FIGS. 1A and 1B are flowcharts showing the procedure of a semiconductor device manufacturing method according to an exemplary embodiment of the present invention.

In step S-1, a semiconductor element such as a transistor is formed on a principal surface of a semiconductor substrate. For example, a gate electrode is formed on a semiconductor substrate, and ion implantation into the semiconductor substrate is performed using the gate electrode as a mask, and thereby a source and drain region is formed in the semiconductor substrate. Note that the method for forming a semiconductor element is not limited to the above one.

In step S-11, a first interlayer insulation film is formed so as to cover the semiconductor element formed in step S-1.

In step S-12, a conductive film of a conductive substance, such as a metal film, is formed on the first interlayer insulation film, and the conductive film is patterned into a first wiring pattern.

In step S-13, defect inspection is performed on the first wiring pattern in order to detect an unintentional short defect portion of the first wiring pattern. If a short defect portion has been detected in the first wiring pattern, the process goes ahead to step S-14, whereas, if no short defect portion has been detected in the first wiring pattern, the process jumps to the next step of step S-15.

Figure 2A:
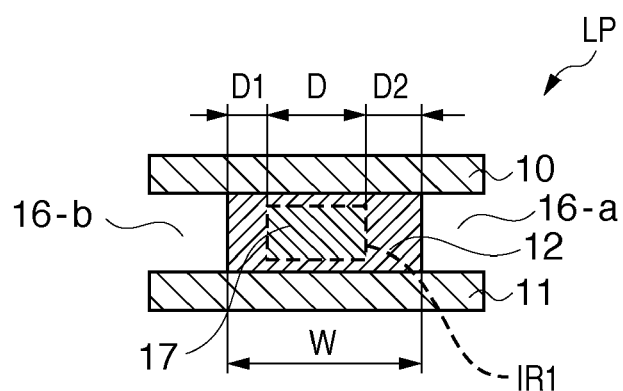
FIGS. 2A to 2C are plan views illustrating the details of a first irradiated region in a first irradiation step (S-14).
Figure 2B:
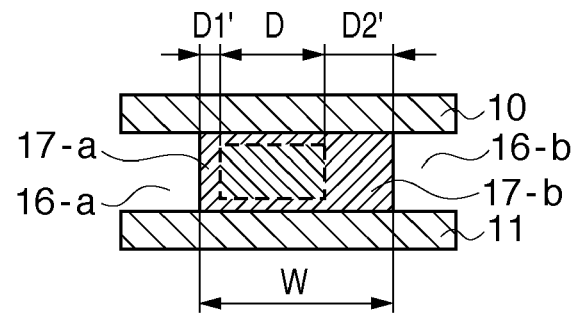
Figure 2C:
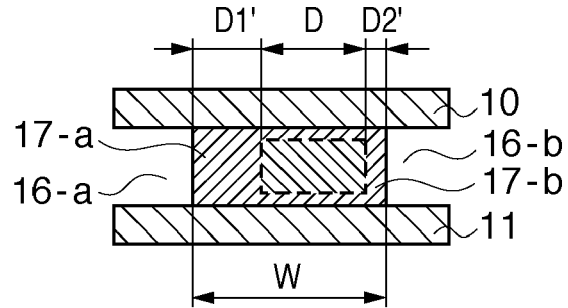

In step S-14, a focused ion beam is applied to a first irradiated region IR1 that is positioned on the inner side of a short defect portion 12 of the first wiring pattern in a direction along a plane parallel to the principal surface. This selectively removes a first portion 17 (see. FIGS. 2A to 2C) of the first wiring pattern that corresponds to the first irradiated region IR1 (first irradiation step).

Figure 3:
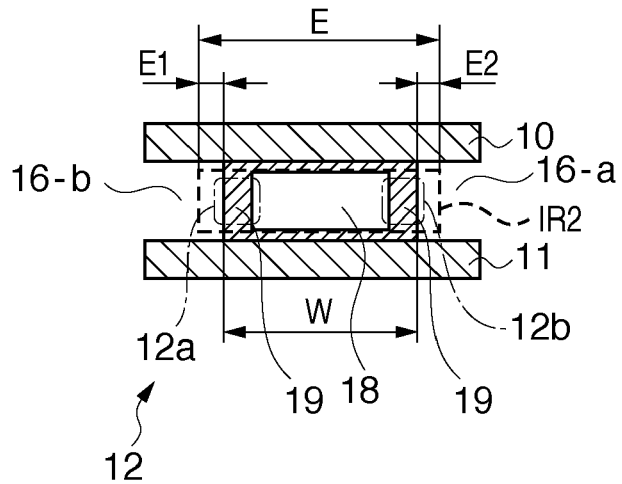
FIG. 3 is a plan view illustrating the details of a second irradiated region in a second irradiation step (S-15).

In step S-15, a focused ion beam is applied to a second irradiated region IR2 that includes regions 12a and 12b that are positioned on the outer side of the short defect portion 12 of the first wiring pattern in the direction along the plane parallel to the principal surface. This removes second portions 19 (see. FIG. 3) of the first wiring pattern that correspond to the second irradiated region IR2 (second irradiation step).

Note that steps S-11 to S-15 are included in a manufacturing procedure for the first wiring pattern. In the case of adopting a multilayer wiring process, a manufacturing procedure similar to the procedure is performed for the second and subsequent wiring patterns.

FIG. 1B shows the manufacturing procedure for the (n)th wiring pattern that is the uppermost wiring pattern (steps S-n1 to S-n5), without showing manufacturing procedures from for the second wiring pattern to for the (n−1)th wiring pattern (where n is an integer equal to or larger than three).

In step S-101, a passivation film is formed so as to cover the (n)th wiring pattern.

The details of each step, from steps S-11 to S-15, will be described using the first wiring pattern as an example.

A semiconductor element was formed on a semiconductor substrate (S-1) and then a first interlayer insulation film is formed (S-11). The first interlayer insulation film may be a BPSG film that is formed of a boron- or phosphorus-doped silicon oxide film, or a silicon oxide film formed by plasma CVD, for example. After the formation of the insulation film, a contact plug is formed that is intended to electrically connect the semiconductor element and a first wiring pattern as necessary.

The first wiring pattern is formed (S-12). Specifically, a conductive film including, for example, aluminum, is deposited on the interlayer insulation film and on the contact plug. The conductive film is subsequently formed into a desired wiring pattern (i.e. the first wiring pattern) using a photolithographic technique and dry-etched, for example.

Then, a defect inspection is conducted in order to detect an unintentional short defect portion in the first wiring pattern (S-13). The defect inspection step detects a defect by image comparison between the chips or primitive cells that form a repeating pattern, using a bright-field optical pattern-defect inspection apparatus, for example. Such a defect inspection apparatus outputs data about the coordinates of a defect, the size of a defect, the type of a defect, and the like. Note that, although an optical defect inspection apparatus using bright field microscopy is used as an example, an inspection apparatus may be an optical defect inspection apparatus using dark field microscopy or a defect inspection apparatus using a scanning electron microscope (SEM). Alternatively, a laser scattering inspection system may be used.

Steps S-14 and S-15, in which a short defect portion detected by the defect inspection is repaired (removed) using a focused ion beam (FIB), will be described. An FIB apparatus to be used for repairing may be an FIB/SEM composite apparatus that is also equipped with an SEM (scanning electron microscope). The FIB/SEM composite apparatus is capable of alternately repeating SEM observations and a repair process with FIB, without breaking vacuum conditions.

With such an FIB/SEM composite apparatus, it is possible to review an image of a defect that has been detected in the defect inspection step. Specifically, an SEM image of a defect detected by defect inspection is used for reviewing the type, size, and shape of the defect and thereby for determining whether or not the defect is a short defect portion that needs to be repaired (S-13).

A short defect portion that has been determined to be repaired (YES in S-13) is irradiated with a focused ion beam (FIB) of gallium ions, for example (S-14 and S-15). Since a conductive material such as metal in the short defect portion is sputtered by the ion beam, it becomes possible to cut the short defect portion. In these steps, it is necessary to determine which region should be irradiated with a focused ion beam.

Assuming the use of recent submicron-order fine wiring, it is important to consider not only the cutting of a short defect portion but also the reduction of damage to a wiring pattern, an insulation film, and a semiconductor element that are located around or below a short defect portion.

According to the present exemplary embodiment, the following process is performed so that a short defect portion of a wiring pattern can be repaired (removed) while reducing damage to a wiring pattern around or below the short defect portion. Specifically, in consideration of irradiation errors in irradiating a cut region of a short defect portion, the process for cutting a short defect portion with a focused ion beam is performed in two steps: the first irradiation step of irradiating the inside of a short defect portion in a direction along the plane parallel to the principal surface; and the second irradiation step of irradiating the short defect portion including the insulation film. Note that the principal surface as used herein refers to the one surface of the semiconductor substrate on/in which a semiconductor element is formed.

The details of the first irradiated region in the first irradiation step (S-14) will be described with reference to FIGS. 2A to 2C. FIGS. 2A to 2C are plan views illustrating the details of the first irradiated region in the first irradiation step (S-14).

In a wiring pattern (first wiring pattern) LP illustrated in FIG. 2A, metal lines 10 and 11 extend approximately parallel to each other. A short defect portion 12 of the wiring pattern LP is an unintentional defect pattern that establishes a short circuit between the metal lines 10 and 11.

Insulation films (first interlayer insulation films) 16-a and 16-b are located around the short defect portion 12 between the metal lines 10 and 11.

A first portion 17 that corresponds to a first irradiated region IR1 is a portion of the short defect portion 12 that is to be irradiated with a focused ion beam and removed in the first irradiation step (S-14). The first irradiated region IR1 is positioned on the inner side of the short defect portion 12 in the direction along the plane parallel to the principal surface. If W is the width of the short defect portion 12 along lines which are shorted (i.e. the direction along the plane parallel to the principal surface) and D is the cut width of the short defect portion 12, the cut width is set so as to satisfy D<W as illustrated in FIG. 2A. This prevents the insulation films 16-a and 16-b from being irradiated with the focused ion beam.

A technique for repairing a short defect portion without causing damage to an insulation film may be implemented if the distances D1 and D2 from the first irradiated region IR1 (first portion 17) irradiated with a focused ion beam to the boundaries between the short defect portion 12 and the insulation films 16-b and 16-a are set so as to be greater than the maximum amount of displacement in the position irradiated with the focused ion beam. The details will be described below.

Δd is assumed to be the maximum amount of displacement for the first irradiated region IR1 (first portion 17). The first irradiated region IR1 is set so as to satisfy the following two conditions: D1>Δd and D2>Δd. By doing so, even if the first irradiated region IR1 is displaced in either lateral direction, a short defect portion can be cut without causing any damage to the insulation films 16-a and 16-b. FIG. 2B illustrates the case where a focused-ion-beam irradiated region is displaced the maximum (Δd) to the left, and FIG. 2C illustrates the case where a focused-ion-beam irradiated region is shifted the maximum (Δd) to the right. Here, short defect portions partitioned to the left and right with a focused ion beam are denoted by 17-*a* and 17-*b*, respectively. The short defect portions 17-*a* and 17-*b* are assumed to have widths of D1' and D2', respectively. In consideration of the two conditions, D1>Δd and D2>Δd, the widths D1' and D2' respectively satisfy the following mathematical expressions (1) and (2).

$$0 < D1 - \Delta d \leq D1' \leq D1 + \Delta d \quad (1)$$

$$0 < D2 - \Delta d \leq D2' \leq D2 + \Delta d \quad (2)$$

Specifically, it can be seen that, if the two conditions, D1>Δd and D2>Δd, are satisfied, neither the insulation film 16-*a* nor 16-*b* are damaged because neither of them are irradiated with an ion beam in the first irradiation step (S-14). For example, if the maximum amount of displacement of a focused-ion-beam irradiated region that an FIB device can handle is 0.15 μm, the first irradiated region IR1 should be set so as to satisfy D1>0.15 μm and D2>0.15 μm. The same applies to the range of irradiation in a direction across the width W (i.e. in the direction along the plane parallel to the principal surface), that is, in the direction of a space between lines 10, 11 which are shorted in the first wiring pattern.

The details of the second irradiated region in the second irradiation step (S-15) will be described with reference to FIG. 3. FIG. 3 is a plan view illustrating the details of the second irradiated region in the second irradiation step (S-15).

A region 18 that has been removed in the first irradiation step (S-14) is approximately at the same position and of the same shape as the first irradiated region IR1 (see. FIGS. 2A to 2C).

Second portions 19 that correspond to the second irradiated region IR2 is the portion of the short defect portion 12 that is to be irradiated with a focused ion beam and removed in the second irradiation step (S-15). The second irradiated region IR2 includes regions 12*a* and 12*b* that are positioned on the outer side of the short defect portion 12 in the direction along the plane parallel to the principal surface. The second irradiated region IR2 contains the first irradiated region IR1 (see. FIGS. 2A to 2C).

The lateral range of the second irradiated region IR2 irradiated with a focused ion beam is determined in the similar manner to in the first irradiation step of irradiating the inside of the short defect portion 12; the width E of the second irradiated region IR2 is set so as to be greater by E1 plus E2 in the lateral direction than the width W of the short defect portion. Here, E1 and E2 are set so as to be greater than an irradiation error Δd in irradiating with a focused ion beam. With this method, the second portion 19 of the short defect portion 12 between the wirings can be removed with reliability. The same applies to the range of irradiation in a direction across the width E (i.e. in the direction along the plane parallel to the principal surface), that is, in the direction of a space between lines 10, 11 which are shorted in the first wiring pattern.

Since the second portions 19 of the short defect portion 12 are removed in a short time in the second irradiation step (S-15), the time that the insulation films 16-*a* and 16-*b* are irradiated with ion beams is reduce to be shorter than a case where both of the first portion 17 and the second potions 19 are removed by irradiation at once. In particular, as to the regions (conductive film patterns) 12*a* and 12*b* positioned on the outer side of the short defect portion 12 in the direction along the plane parallel to the principal surface, since not only their upper surfaces but also their side faces are exposed to a focused ion beam, they can be removed in a short time. This reduces damage that can be done to an insulation film around or below a short defect portion of a wiring pattern when the short defect portion is removed with a focused ion beam.

As described above, according to the present exemplary embodiment, it is possible to repair a short detect portion of a wiring pattern while reducing damage to proper wiring patterns and to semiconductor elements.

In addition, since the process includes a first irradiation step of irradiating a central part of a short defect portion with a focused ion beam and a second irradiation step of irradiating a short defect portion that has been left in the first irradiation step while causing minimal damage, it is also possible to reduce damage to a layer that is not repaired and that is around or below the short defect portion.

Note that the irradiation energy of a focused ion beam used in the second irradiation step may be lower than the irradiation energy of a focused ion beam used in the first irradiation step. In this case, damage to an insulation film around or below a short defect portion can be further reduced.

Note also that, as illustrated in FIG. 4B, a second irradiated region IR20 may be positioned on the outer side of the first irradiated region IR1 (see. FIGS. 2A to 2C) of the short defect portion 12 in the direction along the plane parallel to the principal surface. Each of the second irradiated regions IR20 overlaps with an edge of the first irradiated region IR1. In this example, a short defect portion that has been left in the first irradiation step (S-14) is effectively irradiated with a focused ion beam, which reduces damage to a region 18 (see FIG. 4A) where an insulation film was exposed in the first irradiation step.

Moreover, as illustrated in FIG. 4C, a second irradiated region IR21 may overlap the second portions 19 (see FIG. 3) such that the second irradiated regions IR21 do not overlap with the first irradiated region IR1 (see. FIGS. 2A to 2C) of a short defect portion 12. In other words, in consideration of the lateral expansion of focused-ion-beam sputtering, the second irradiated region IR21 may be set so as not to overlap with the first irradiated region IR1. This further reduces damage to the region 18 where an insulation film was exposed.

As another alternative, the entire first irradiated region IR1 does not have to be within the short defect portion 12 in the direction along the plane parallel to the principal surface. If at least major part of the first irradiated region IR1 is positioned within the short defect portion 12, damage to a region where an insulation film was exposed can be reduced. That is, damage can be reduced as long as area of the side face of the short defect portion 12 is increased more in the second irradiation step than in the first irradiation step.

While the foregoing description has explained how to repair a short defect portion in the first wiring pattern, a similar short-defect-portion repair process may be performed for a second and subsequent wiring patterns in the case of a multilayer wiring process.

The semiconductor device manufacturing method according to the present exemplary embodiment is applicable to every semiconductor device. It is effective for, for example, devices such as imaging devices (e.g., CMOS sensors or CCD image sensors) that are characteristically incapable of adopting redundancy circuits. In particular, the semiconductor device manufacturing method according to the present exemplary embodiment is effective for a sensor that includes a photoelectric conversion element, a transfer transistor, a charge-voltage convertor, an output transistor, and a signal line included in the wiring patter of one layer in a multilayer wiring layer structure. The photoelectric conversion element converts light into charges. The photoelectric conversion element is, for example, a photodiode and is formed as a semiconductor region in the semiconductor substrate. The transfer transistor transfers the converted charges to the charge-voltage convertor. The transfer transistor has gate on the semiconductor substrate, and has source and drain as semiconductor regions in the semiconductor substrate. The charge-voltage convertor converts the transferred charges to a voltage. The charge-voltage convertor is, for example, a floating diffusion resion and is formed as a semiconductor region in the semiconductor substrate. The output transistor outputs, to the signal line, a signal corresponding the voltage of the charge-voltage convertor. The output transistor has gate on the semiconductor substrate, and has source and drain as semiconductor regions in the semiconductor substrate. It is also effective for a semiconductor device with a large area.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-217324, filed Aug. 26, 2008, which is hereby incorporated by reference herein in its entirety.

What is claimed is:

1. A method for manufacturing a semiconductor device that includes a semiconductor substrate having a principal surface above which a wiring pattern is formed on an insulation film, the method comprising:
    a first irradiation step of irradiating a first irradiated region with a focused ion beam so as to selectively remove a first portion corresponding to the first irradiated region of the wiring pattern, the first irradiated region being positioned on an inner side of a short defect portion of the wiring pattern in a direction along a plane parallel to the principal surface; and
    a second irradiation step of, after the first irradiation step, irradiating a second irradiated region with a focused ion beam so as to remove a second portion corresponding to the second irradiated region of the wiring pattern, the second irradiated region including a region that is positioned on an outer side of the short defect portion in the direction along the plane parallel to the principal surface.

2. The method for manufacturing a semiconductor device according to claim 1, wherein
    an irradiation energy of the focused ion beam used in the second irradiation step is lower than an irradiation energy of the focused ion beam used in the first irradiation step.

3. The method for manufacturing a semiconductor device according to claim 1, wherein
    the second irradiated region includes the first irradiated region.

4. The method for manufacturing a semiconductor device according to claim 1, wherein
    the second irradiated region is positioned on an outer side of the first irradiated region of the short defect portion in the direction along the plane parallel to the principal surface.

5. The method for manufacturing a semiconductor device according to claim 4, wherein
    the second irradiated region does not overlap with the first irradiated region of the short defect portion in the direction along the plane parallel to the principal surface.

6. The method for manufacturing a semiconductor device according to claim 1, further comprising a step of, before the first irradiation step, forming a photoelectric conversion element in the semiconductor substrate, and forming a transfer transistor on/in the semiconductor substrate, and then forming the wiring pattern above the semiconductor substrate, the photoelectric conversion element converting light into charges, the transfer transistor transferring the converted charges, the wiring pattern including a signal line for transferring a signal corresponding to the transferred charges.

7. A method for manufacturing a photoelectric conversion apparatus having a principal surface in which a photoelectric conversion element for converting light into charges is formed and in/on which a transfer transistor for transferring the charges generated by the photoelectric conversion element is formed and above which a wiring pattern formed on an insulation film, the wiring pattern including a signal line for transferring a signal corresponding to the transferred charges, the method comprising:
    a first irradiation step of irradiating a first irradiated region with a focused ion beam so as to selectively remove a first portion corresponding to the first irradiated region of the wiring pattern, the first irradiated region being positioned on an inner side of a short defect portion of the wiring pattern in a direction along a plane parallel to the principal surface; and
    a second irradiation step of, after the first irradiation step, irradiating a second irradiated region with a focused ion beam so as to remove a second portion corresponding to the second irradiated region of the wiring pattern, the second irradiated region including a region that is positioned on the outer side of the short defect portion in the direction along the plane parallel to the principal surface,
    wherein an irradiation energy of the focused ion beam used in the second irradiation step is lower than an irradiation energy of the focused ion beam used in the first irradiation step.

* * * * *